(12) United States Patent
Choi

(10) Patent No.: US 6,272,051 B1
(45) Date of Patent: Aug. 7, 2001

(54) NONVOLATILE SEMICONDUCTOR MEMORY DEVICE HAVING A REFERENCE CELL ARRAY

(75) Inventor: Soo-Hwan Choi, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/474,877

(22) Filed: Dec. 29, 1999

(30) Foreign Application Priority Data

Dec. 30, 1998 (KR) ................................................. 98-62263

(51) Int. Cl.⁷ ..................................................... G11C 16/04
(52) U.S. Cl. .................................. 365/185.29; 365/185.2; 365/185.22
(58) Field of Search ........................... 365/185.2, 185.22, 365/185.21, 210, 185.29, 185.3

(56) References Cited

U.S. PATENT DOCUMENTS

| 5,335,198 | * | 8/1994 | Van Buskirk | 365/218 |
| 5,418,743 | * | 5/1995 | Tomioka | 365/189.01 |
| 5,828,601 | * | 10/1998 | Hollmer | 365/210 |
| 6,055,187 | * | 4/2000 | Dallabora | 365/185.21 |
| 6,108,259 | * | 8/2000 | Choi | 365/210 |

* cited by examiner

Primary Examiner—A. Zarabian
(74) Attorney, Agent, or Firm—Marger Johnson & McCollom, P.C.

(57) ABSTRACT

A semiconductor memory device having a plurality of reference cells for detecting states of and verifying written data in plurality of memory cells includes a memory cell array formed of the plurality of memory cells and a reference cell array formed of a plurality of units, each unit formed of the plurality of reference cells, reference cell having a same size as that of each memory cell. A sense amplifier circuit detects a difference between current flowing through a memory cell and a corresponding reference cell. Each unit in the reference cell array is formed of a plurality of the reference cells serially connected between the sense amplifier circuit and a control circuit for controlling the reference cells.

13 Claims, 4 Drawing Sheets

NONVOLATILE SEMICONDUCTOR MEMORY DEVICE HAVING A REFERENCE CELL ARRAY

FIELD OF THE INVENTION

The present invention relates to nonvolatile semiconductor memories and, more particularly, to nonvolatile memory such as a NOR-type flash memory device that includes a reference cell array in a sensing area.

BACKGROUND OF THE INVENTION

A flash memory employing a NOR-type cell array (hereinbelow, referred to as a NOR-type flash memory) operates at a faster speed relative to a NAND-type flash memory. For this reason, a NOR-type flash memory is often used in a high frequency system.

FIG. 1 is a cross sectional view of a memory cell for a NOR-type flash memory device. The NOR-type flash memory device is constructed of N-type source region 3 and N-type drain region 4 formed in P-type substrate (or well) 2. The regions 3 and 4 are isolated from each other through a channel region that is defined in substrate 2. Floating gate 6 is formed over the channel region through thin insulating film 7. Insulating film 7 is under about 100 Å thick. Insulating film 9 is formed on floating gate 6 isolating control gate 8 from floating gate 6. Insulating film 9 is preferably an Oxide-Nitride-Oxide (O—N—O film). Source region 3 is connected to source voltage Vs. Drain region 4 is connected to drain voltage Vd. Control gate 8 is connected to gate voltage Vg. Substrate 2 is connected to bulk voltage Vd.

During programming, a selected memory cell is programmed by means of a hot electron injection between the channel region and floating gate. To induce the hot electron injection, the source and substrate are held to a ground voltage while a high voltage (e.g., Vg=10V) is applied to the control gate and a voltage, 5V through 6V, is provided to the drain. After programming, a threshold voltage of the selected memory cell is increased therefrom due to deposition of electrons. To read data from the programmed cell, a voltage of about 1V is applied to the drain, a power source voltage (or about 4.5V) is applied to the control gate, and the source is held to the ground voltage. Since the increased threshold voltage of the programmed memory cell acts as an blocking potential to the gate voltage during reading, the programmed cell is considered as an off-cell that has a threshold voltage between 6V and 7V.

Erasing a memory cell is accomplished using the Fowler-Nordheim (F-N) tunneling effect, in which the control gate is coupled to a high negative gate voltage Vg of about −10V and the substrate (or bulk) to a positive bulk voltage Vb of about 5V. Under these conditions, the drain is at a high impedance of floating state. A strong electric field induced by the voltage bias conditions, between the control gate and bulk region, causes the electrons movement into the source. The F-N tunneling typically occurs when an electric field of 6~7 MV/cm is developed between the floating gate and bulk region that are separated by the thin insulating film having a thickness of under 100 Å. Since the erased cell has a lower threshold voltage than before the erase operation. It is sensed as an on-cell which has a threshold voltage between 1~3V.

Flash memory device include helpful verifying modes used each after programming, erasing, and post-programming operations, so that a distribution profile and cell voltage threshold levels are adjusted to reliable conditions. A first verifying mode is program verifying. Program verifying is conducive to detecting whether threshold voltages of programmed cells are within an expected voltage range. The voltage range is, for instance, higher than 6V as shown in FIG. 2. If the threshold voltage is not within the expected voltage range, the cells might require further programming. If threshold voltages of programmed memory cells are higher than 6V, additional programming is inhibited. In contrast, if the threshold voltages are lower than 6V the cells are further programmed and verified. A second verifying mode is erased verifying. Erase verifying checks whatever erased cells have threshold voltages lower than a predetermined level such as 3V and causes the under-erased cells to be forced into an additional erase mode. As with the program verifying mode, cells having threshold voltages under the 3V after erasing are prevented from the additional erasing operations. Over-erased memory cells are occasionally provided even after the program and erase verifying modes are effectuated. When this happens, an additional verifying mode, i.e., over-erasure verifying, is provided to the flash memory device. The over-erasure verifying mode is accomplished after completing a post-programming operation that cures the over-erased memory cells, in which the post-programming is terminated when threshold voltages of the over-erased memory cells are over the 1V.

While the verifying modes detect whether threshold voltages of the programmed and erased cells are within a predetermined voltage range, reading the memory cells checks whether selected memory cells are on-cells (i.e., erased cells) or off-cells (i.e., programmed cells). A relationship exists between a threshold voltage established by programming and erasing operations and a voltage bias condition set by voltages provided to a gate electrode, drain and source electrodes. Current through a programmed cell is close to zero while current passing through an erased cell is about 20 $\mu$A.

FIG. 3 is block diagram of a conventional flash memory device for conducting verifying and reading operations. Main memory cell array 10 and reference cell array 20 are coupled to sense amplifier circuit 30. Main memory cell array 10 is coupled to control circuit 12. Reference cell array 20 is coupled to control circuit 22. Reference cell array 20 is formed of a plurality of reference cells such as cell Rcell0 that is similar to a cell (not shown) of memory cell array 10. When the device is in a verifying mode (the erase verifying, the over-erasure verifying, or the program verifying mode), it is desirable that the current through the reference cell be about equal to the current through the memory cell. Table 1 lists example voltages for the different modes of operation for the device shown in FIG. 3. When the device is in a read mode, however, it is desirable that the current through the reference cell be about half of the current through the memory cell. Since the memory and reference cells are designed to have nearly identical structural sizes, it is necessary to modify the bias condition of the reference cells relative to the memory cell to meet the current requirements.

TABLE 1

| Operation mode | Gate voltage of memory cell (Vg) | Gate voltage of the reference cell (Vgr) |
| --- | --- | --- |
| Reading | 4–5 V | 0.7 × (4–5 V) |
| Program verifying | 6.5 V | 3.5 V |
| Erase verifying | 3.5 V | 3.5 V |
| Over-erasure verifying | 2.5 V | 4.5 V |

Referring to Table 1, the gate voltage Vgr applied to the control gate of reference cell Rcell0 is 0.7×Vg (gate voltage of the memory cell) for reading a state of the memory cell. FIG. 4 is a graph of the current and voltage through the memory cell plot A- and the reference cell plot B. As evident in FIG. 4, the selected memory cell can be successfully detected as an on-cell at sensing position P1 but not at positions P2 and P3. The relatively small current margin at sensing position P2 and P3 between the memory cell and the reference cell, make it difficult for a sense amplifier (not shown) to sense and amplify the difference. Although the gate voltage applied to the reference cell is designed to cause the current of the reference cell to be a half of that of the memory cell in a read mode, it may not be easy to control the reference current as it appears at an input of the sense amplifier circuit. That is, the current flowing through the reference ell as it appears at the input of the sense amplifiers varies with variations in an off-set voltage at the input of the sense amplifier circuit variations in operating voltage ranges between the memory cell and reference cell, and the like. The resulting unstable reading conditions might cause reading failures such that a substantial on-cell would be read out as an off-cell.

SUMMARY OF THE INVENTION

It is an object of the present invention to overcome the disadvantageous associated with prior are memory devices.

It is another object of the invention to provide a flash memory device having a stable operation without reading failures.

It is yet another object of the invention to provide a flash memory device having a reference cell circuit having enough current margin for reliably reading a memory cell.

In order to accomplish those objects, a memory of the invention, having reference cells for detecting states of memory cells and for verifying written data in the memory cells, includes: a memory cell array formed of the memory cells; a reference cell array formed of a plurality of units of the reference cells, the reference cell having the same size with that of the memory cell; and a sense amplifier circuit for detecting a difference between current of the memory cell and reference cell. Each of the units in the reference cell array is formed of a plurality of the reference cells serially connected between the sense amplifier circuit and a circuit for controlling the reference cells. The reference cell control circuit comprises a plurality of switching transistors for determining electrical connections of the reference cells.

BRIEF DESCRIPTION OF THE DRAWINGS

The foregoing and other objects, features, and advantages of the invention will become more readily apparent from the following detailed description of a preferred embodiment that proceeds with relevance to the following drawings.

In the figures, like reference numerals denote like or corresponding parts.

DETAILED DESCRIPTION OF PREFERRED EMBODIMENTS

Figure 1:
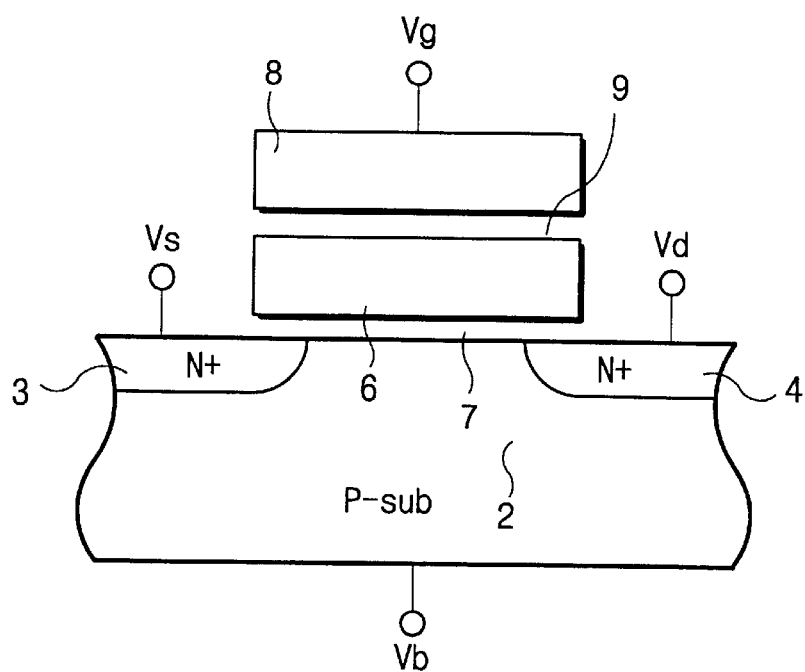
FIG. 1 is a cross-sectional view of a flash memory cell.
Figure 2:
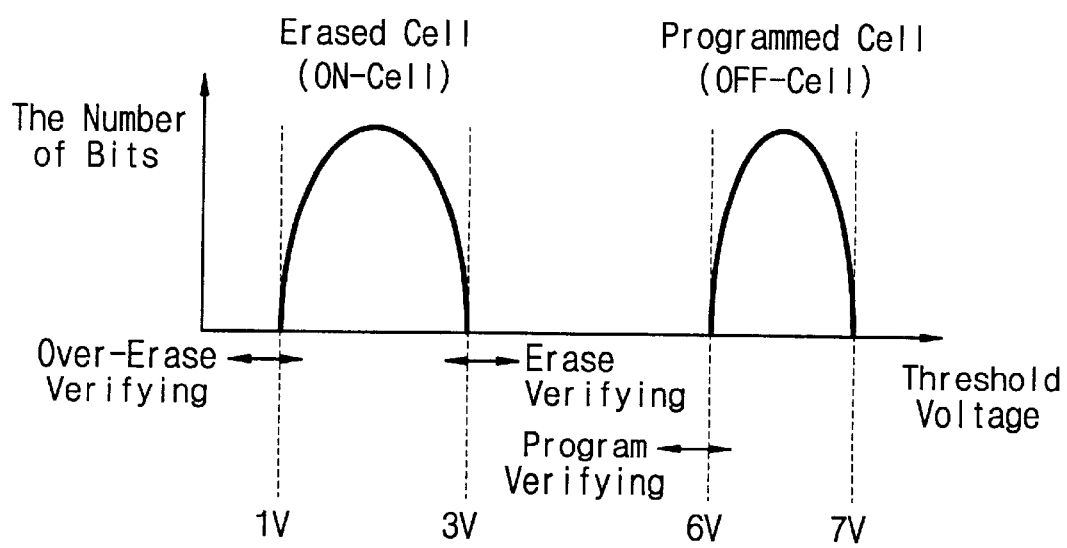
FIG. 2 is a graph of the threshold voltages relative to programmed and erased memory cells.
Figure 3:
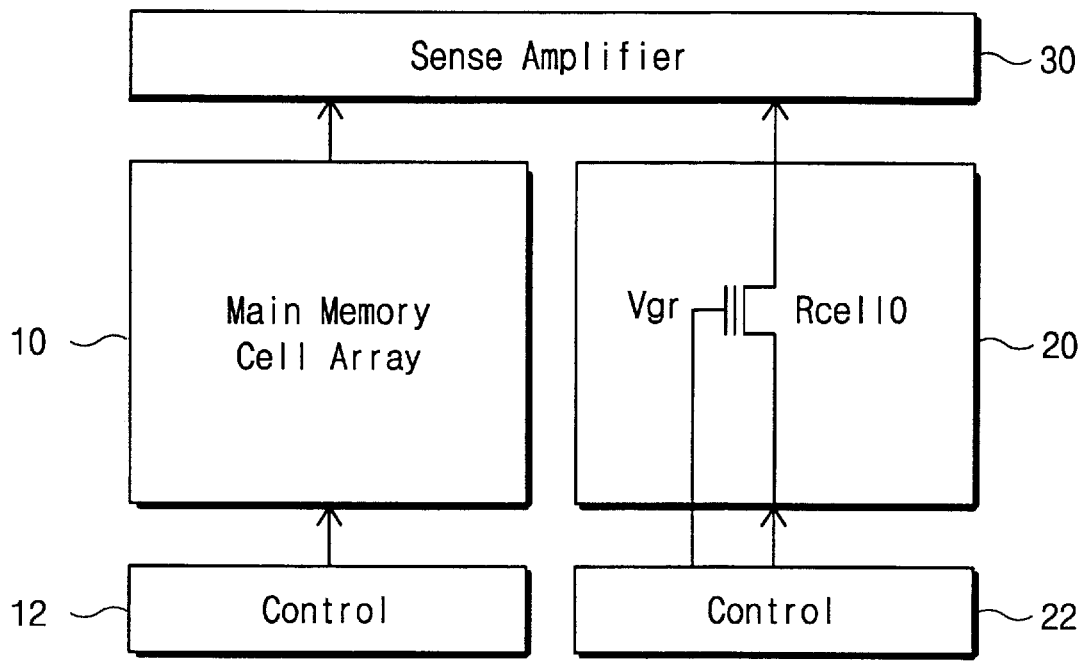
FIG. 3 is a block diagram of a conventional flash memory device.
Figure 5:
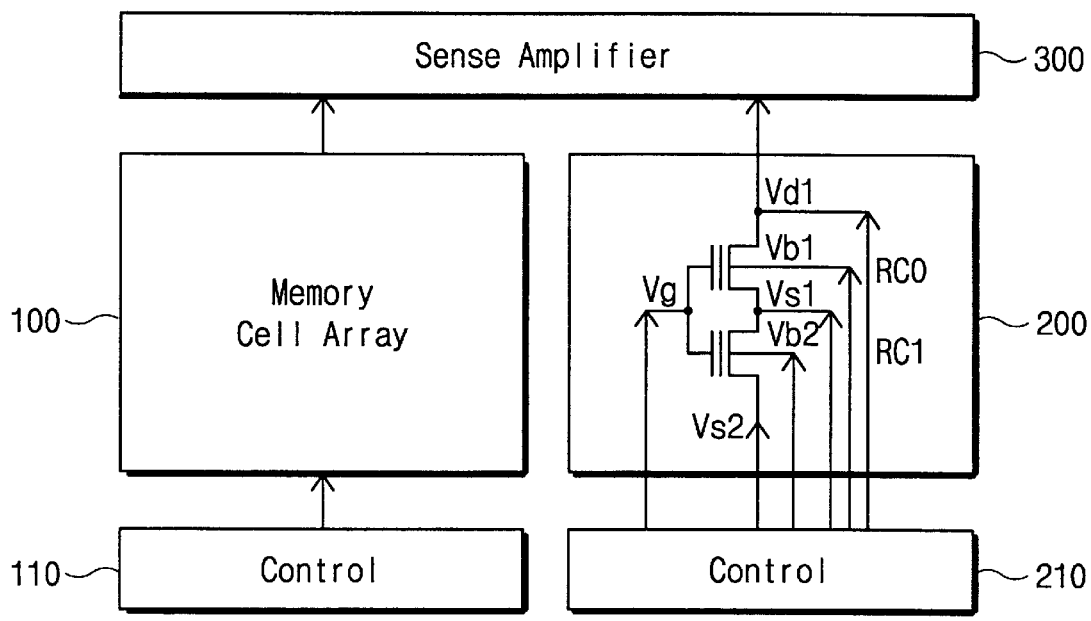
FIG. 5 is a block diagram of a flash memory device according to the first embodiment of the invention.

FIG. 5 is a block diagram of one embodiment of the present invention. Referring to FIG. 5, the NOR-type flash memory device has memory cell array 100, reference cell array 200, memory cell control block 110, reference cell control block 210, and sense amplifier circuit 300. Memory cell array 100 comprises a plurality of memory cells coupled to bitlines and wordlines. Memory cell control block 110 controls programming, erasing, verifying, and reading operations of the memory cell array 100. The structure of memory cell array 100 and memory cell control block 110 are similar to those of FIG. 3. Reference cell array 200 comprises a plurality of units. Each unit includes two serially-connected reference cells Rc0 and Rc1 between sense amplifier circuit 300 and reference cell control block 210. Each unit of two reference cells Rc0 and Rc1 are arranged in reference cell array 200 to correspond to each of memory cells arranged in memory cell array 100. Each reference cell is constructed of a control gate, a floating gate, a source region, a drain region, and a channel region between the source and drain regions (refer to FIG. 1, identical to the memory cell). The control gates of of reference cells Rc0 and Rc1 are commonly coupled to reference cell control block 210 for receiving reference gate voltage Vg. The drain region, a bulk region, and the source region of reference cell Rc0 coupled to reference cell control block 210 for receiving voltages Vd1, Vb1, and Vs1, respectively. The source voltage Vs1 of the reference cell Rc0 is Vs1 also becomes the drain voltage of reference voltage Rc1. The bulk region and the source region of reference cell Rc1 coupled to reference control block 210 control voltages Vb2 and Vs2, respectively.

Reference cell control block 210 includes switching transistors (not shown) operating in CMOS logic for determining current paths or for supplying the control and operating voltages, i.e., Vg, Vd1, Vb1, Vs1, Vb2, and Vs2 corresponding to the operating mode. The reference cell control block 210 provide the control signals for controlling the operating modes of verifying and reading for relevance cells 200 simultaneously with memory cell control block 110 providing the controls for controlling the verifying and reading operations against the memory cells. Sense amplifier circuit 300 compares a current from a selected memory cell, for verifying or reading, with the current from the reference cell unit, and generates a signal indicative of a state of the selected memory cell, that is, whether the memory cell is an on-cell or an off-cell.

Table 2 shows voltage conditions for the memory cell and reference cell. One unit of reference cells Rc0 and Rc1 is activated in the verifying mode while the remaining units of reference cells Rc0 and Rc1 act as an current source in the reading mode. In Table 2, the gate voltage of the reference cell (Vg) is applied to a selected one or two reference cells, according to the operating mode, i.e., reading, program verifying, erase verifying, and over-erasure verifying operations.

TABLE 2

| Operation mode | Gate voltage of memory cell | Gate voltage of the reference cell (Vgr) |
|---|---|---|
| Reading | 4–5 V | 4–5 V |
| Program verifying | 6.5 V | 3.5 V |
| Erase verifying | 3.5 V | 3.5 V |
| Over-erasure verifying | 2.5 V | 4.5 V |

In the verifying mode, reference cell Rc0 is selected with activated voltages Vg, Vd1, Vd1, and Vs1 supplied from reference cell block 210. The source voltagevsl is grounded. This bias condition is similar to that shown in Table 1.

In the reading mode, however, all of reference cells Rc0 and Rc1 are forced into forming a current path that becomes a reference to determine a state of the selected memory cell. Vd1 is applied to the drain of reference cell Rc0 and Vs2 is applied to the source of reference cell Rc1. At this time, the source voltage Vs1 does not have any voltage level so as to form a current path from the drain of reference cell Rc0 to source of reference cell Rc1. The control gates of reference cells Rc0 and Rc1 are commonly coupled to a gate voltage Vg of about 4–5V—the same voltage level applied to a control gate of a selected memory cell. Since the two reference cells Rc0 and Rc1, each of which has the same transistor size as the memory cell, form a serial current paths with a twice elongated channel relative to the channel of the memory cell, a half of current from the selected memory cell is applied to sense amplifier circuit 300.

Figure 4:
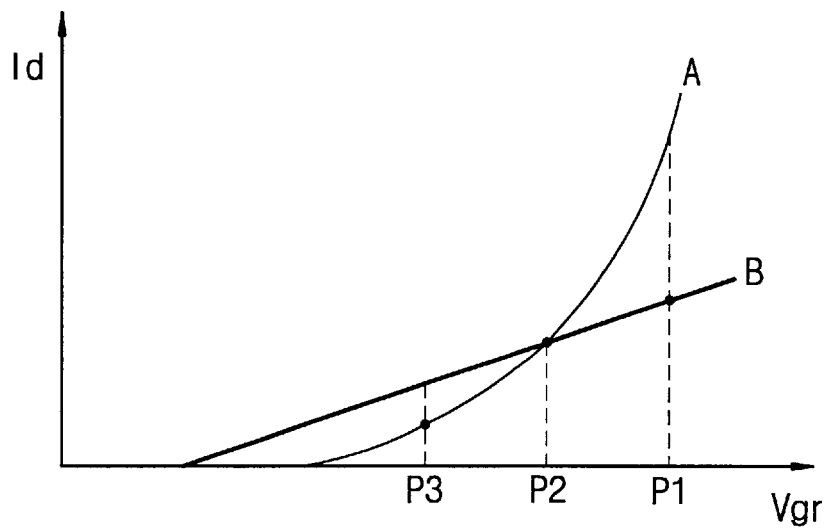
FIG. 4 is a graph of the current flowing through main and reference cells in the device shown in FIG. 3.
Figure 7:
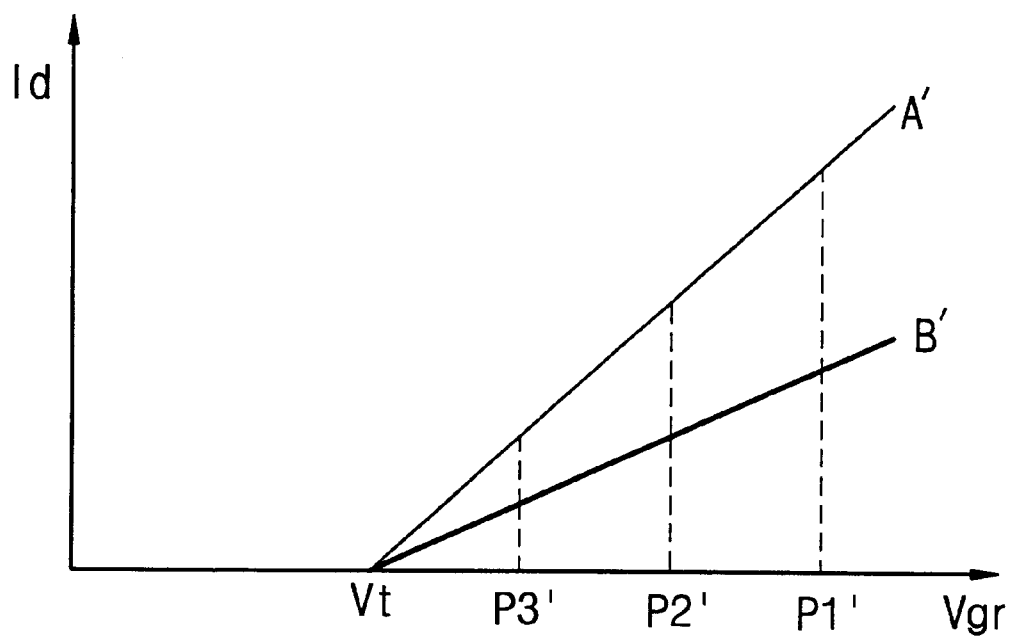
FIG. 7 is a graph of the current flowing through main and reference cells in the device according to the invention.

FIG. 7 is a graph of the current and voltage through the memory cell—PlotA—and the reference cell—PlotB—. As shown in FIG. 7, the voltage margins at sensing positions P2' and P3' are considerably enhanced relative to positions P2 and P3 shown in FIG. 4, as well as sensing point P1'. It may be understood that the slope of plot B' is proportionally due to the twice extended channel length through the reference cell unit rather than that of the selected memory cell.

Figure 6:
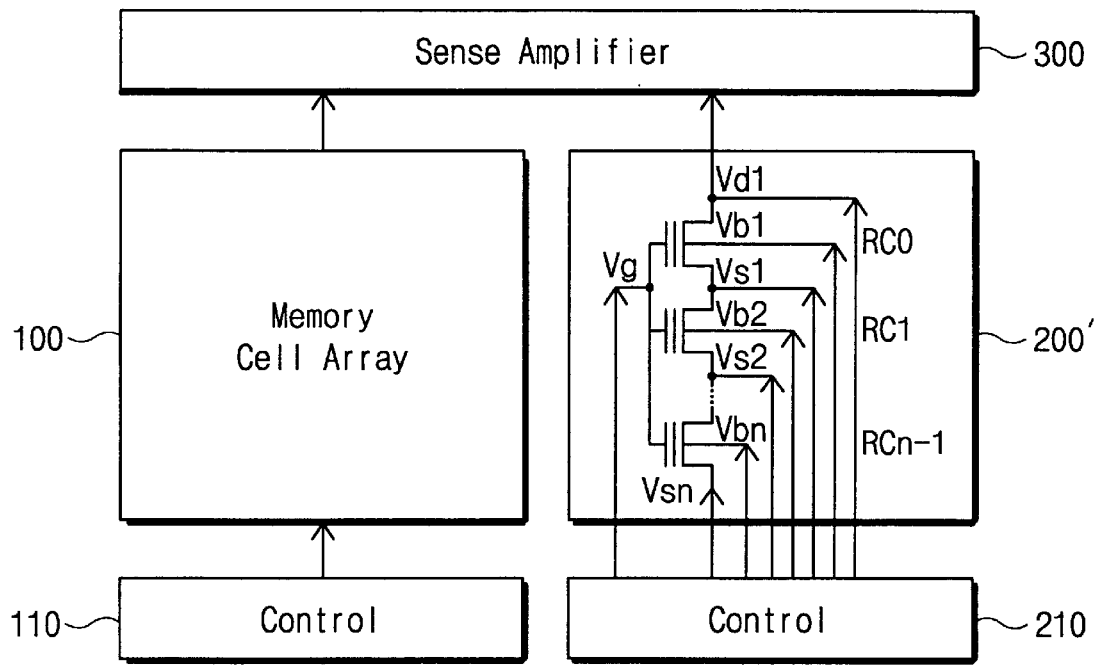
FIG. 6 is a block diagram of a flash memory device according to the second embodiment of the invention.

For the purpose of developing more reading margin, it is possible to construct the reference cell unit conducting in the reading mode as shown in FIG. 6. Referring to FIG. 6, reference cell array 200' is formed of a plurality of a reference units. Each reference unit including a plurality of reference cells, the number of which is more than that shown in FIG. 5. Reference cells Rc0 through Rcn-1 are serially connected between sense amplifier 300 and reference cell control block 210. The number of reference cells in the unit in the reading mode is determined by how much it is necessary to be appropriate in accomplishing a stable voltage margin for reading. In the verifying mode, as the case of FIG. 5, only reference cell Rc0 is activated to flow a reference current, in which Vs1 is grounded.

Having illustrated and described the principles of my invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A semiconductor memory device, comprising:
   a memory cell array formed of a plurality of memory cells;
   a reference cell array formed of a plurality of reference units, each reference unit including a plurality of reference cells, each reference cell having a same size as each memory cell;
   a sense amplifier circuit for detecting a difference between current flowing through a memory cell and a corresponding reference cell; and
   a control circuit for generating a reference cell control signal;
   wherein the plurality of the reference cells are serially connected between the sense amplifier circuit and the control circuit, and
   wherein the plurality of reference cells include a common control terminal for receiving the reference cell control signal.

2. A semiconductor memory device of claim 1 wherein the control circuit comprises a plurality of switching transistors for determining electrical connections of the plurality of reference cells.

3. A semiconductor memory device, comprising:
   a memory cell array including a plurality of memory cells;
   a memory cell control block for controlling operations of the memory cells;
   a reference cell array including a plurality of reference units, each reference unit including a plurality of reference cells;
   a reference cell control block for controlling operations of the reference cells in correspondence with the operations of the memory cells; and
   a sense amplifier circuit for detecting a difference between current flowing through a memory cell and a corresponding reference unit;
   wherein each of the reference units includes a plurality of the reference cells serially connected between the sense amplifier circuit and the reference cell control block; and
   wherein each of the reference cel units includes at least two reference cell control; and commonly connected control input terminal.

4. The semiconductor memory device of claim 3 wherein the reference cell control circuit comprises a plurality of switching transistors for determining electrical connections of the reference cells.

5. A nonvolatile semiconductor memory device, comprising:
   a memory cell array; and
   a reference cell array, the reference cell array including a plurality of reference cell units, each reference cell unit including at least two reference cells having a commonly connected control input terminal.

6. The nonvolatile semiconductor memory device of claim 5 wherein the at least two reference cells includes a first and a second reference cells, the first reference cell having a source commonly connected to a drain of the second reference cell, the source of the first reference cell being grounded during a verifying operation.

7. The nonvolatile semiconductor memory device of claim 5 wherein the at least two reference cells includes a plurality of serially connected reference cells, wherein the number of reference cells is determined by a desired voltage margin during a read operation.

8. A nonvolatile semiconductor memory device, comprising:
   a memory cell array; and
   a reference cell array, the reference cell array including a plurality of reference cell units, each reference cell unit including at least a first and a second reference cells;
   wherein the first reference cell includes a first source, drain, and a gate; and wherein the second reference cell includes a second source, drain, and gate, the first source being connected to the second drain and the first gate being connected to the second gate.

9. The nonvolatile semiconductor memory device of claim 6 further comprising:
a sense amplifier for detecting and amplifying a current difference between current flowing through a reference cell and a corresponding memory cell;
a memory cell array control circuit for controlling the memory cell array; and
a reference cell array control circuit for generating a control signal input to the common control input terminal;
wherein the at least two reference cells are connected between the sense amplifier and the reference cell array control circuit.

10. The nonvolatile semiconductor memory device of claim 8 wherein a number of reference cells is determined by a desired voltage margin during a read operation.

11. The nonvolatile semiconductor memory device of claim 8 wherein a source of the first reference cell is grounded during a verify operation.

12. The nonvolatile semiconductor memory device of claim 8 further comprising:
a sense amplifier for detecting and amplifying a current difference between current flowing through a reference cell and a corresponding memory cell;
a memory cell array control circuit for controlling the memory cell array; and
a reference cell array control circuit for generating a control signal input to the first and second gates.

13. The nonvolatile semiconductor memory device of claim 8:
wherein the memory cell array includes a plurality of memory cells having a memory cell size; and
wherein the first and second reference cells each have a reference cell size substantially the same as the memory cell size.

* * * * *

UNITED STATES PATENT AND TRADEMARK OFFICE
CERTIFICATE OF CORRECTION

PATENT NO. : 6,272,051 B1
DATED : August 7, 2001
INVENTOR(S) : Choi

It is certified that error appears in the above-identified patent and that said Letters Patent is hereby corrected as shown below:

<u>Column 5,</u>
Line 11, "Vd1, Vd1" should read -- Vd1, Vb1 --.
Line 12, "voltagevsl" should read -- voltage Vs1 --.

<u>Column 6,</u>
Line 35, "reference cel" should read -- reference cell --.
Line 47, "two reference cells" should read -- two serially connected reference cells --.

Signed and Sealed this

Twenty-ninth Day of October, 2002

Attest:

JAMES E. ROGAN
Attesting Officer                  Director of the United States Patent and Trademark Office